(12) United States Patent
Choy

(10) Patent No.: US 7,369,450 B2
(45) Date of Patent: May 6, 2008

(54) NONVOLATILE MEMORY HAVING LATCHING SENSE AMPLIFIER AND METHOD OF OPERATION

(75) Inventor: Jon S. Choy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/420,558

(22) Filed: May 26, 2006

(65) Prior Publication Data

US 2007/0279990 A1 Dec. 6, 2007

(51) Int. Cl.
*G11C 7/00* (2006.01)
*G11C 16/06* (2006.01)
*G11C 7/10* (2006.01)

(52) U.S. Cl. ............ 365/205; 365/185.21; 365/185.25; 365/189.05; 365/196; 365/203

(58) Field of Classification Search ........... 365/185.21, 365/185.25, 203, 189.05, 205, 185.23
See application file for complete search history.

(56) References Cited

U.S. PATENT DOCUMENTS

| | | | | |
|---|---|---|---|---|
| 5,581,511 | A | * | 12/1996 | Gaultier et al. ............. 365/202 |
| 5,699,304 | A | * | 12/1997 | Jung et al. ............. 365/189.11 |
| 5,729,493 | A | | 3/1998 | Morton |
| 5,821,792 | A | * | 10/1998 | Miwa ......................... 327/215 |
| 6,011,719 | A | * | 1/2000 | Wang et al. ........... 365/185.21 |
| 6,275,432 | B1 | | 8/2001 | Hardee |
| 6,307,797 | B1 | * | 10/2001 | Fournel et al. ........ 365/189.09 |
| 6,327,184 | B1 | | 12/2001 | Micheloni et al. |
| RE37,593 | E | * | 3/2002 | Etoh et al. ............. 365/189.09 |
| 6,363,015 | B1 | | 3/2002 | Barcelli et al. |
| 6,400,607 | B1 | | 6/2002 | Pasotti et al. |
| 6,445,216 | B1 | | 9/2002 | Bruneau et al. |

(Continued)

FOREIGN PATENT DOCUMENTS

EP 1566809 A1 8/2005

(Continued)

OTHER PUBLICATIONS

Baderna, D. et al.; "A 1.2 V Sense Amplifier for High-Performance Embeddable NOR Flash Memories"; IEEE International Symposium on Circuits and Systems 2005; May 23-26, 2005; pp. 1266-1269; IEEE.

(Continued)

*Primary Examiner*—Ly Duy Pham
(74) *Attorney, Agent, or Firm*—Joanna G. Chiu; Daniel D. Hill

(57) ABSTRACT

A memory comprises a sense amplifier for sensing a logic state of a selected bitline. The sense amplifier includes a first precharge circuit, a current-to-voltage converter, a latch circuit, and a second precharge circuit. The first precharge circuit is for precharging a selected bitline to a first predetermined voltage in response to a first precharge signal. The current-to-voltage converter has a current input coupled to the selected bitline, and a voltage output. A latch circuit has a storage node coupled to the voltage output of the current-to-voltage converter. The second precharge circuit is for precharging the storage node of the latch circuit to a second predetermined voltage in response to a second precharge signal.

22 Claims, 3 Drawing Sheets

U.S. PATENT DOCUMENTS

| | | | |
|---|---|---|---|
| 6,466,059 B1 | 10/2002 | Gaibotti et al. | |
| 6,476,646 B2 | 11/2002 | Sim et al. | |
| 6,519,197 B2 | 2/2003 | Forbes | |
| 6,535,428 B2 | 3/2003 | Pasotti et al. | |
| 6,625,074 B2 | 9/2003 | Forbes | |
| 6,650,147 B2 | 11/2003 | Conte et al. | |
| 6,657,909 B2 | 12/2003 | Baglin et al. | |
| 6,665,213 B1 | 12/2003 | Michael et al. | |
| 6,665,215 B2 * | 12/2003 | Thomas et al. | 365/185.25 |
| 6,717,444 B2 | 4/2004 | Lin et al. | |
| 6,760,265 B2 | 7/2004 | La Rosa | |
| 6,788,112 B1 | 9/2004 | Chan et al. | |
| 6,798,250 B1 | 9/2004 | Wile | |
| 6,822,906 B2 | 11/2004 | Confalonieri | |
| 2002/0180489 A1 | 12/2002 | Ge et al. | |
| 2002/0196689 A1 * | 12/2002 | Kim et al. | 365/207 |
| 2003/0037228 A1 * | 2/2003 | Kelsey et al. | 712/245 |
| 2003/0142568 A1 | 7/2003 | Giove et al. | |
| 2004/0051564 A1 | 3/2004 | Bedarida et al. | |
| 2004/0125678 A1 | 7/2004 | Sinha et al. | |
| 2004/0136253 A1 | 7/2004 | Gupta et al. | |
| 2004/0246800 A1 | 12/2004 | Genevaux et al. | |
| 2004/0252568 A1 | 12/2004 | La Rosa | |
| 2005/0030809 A1 | 2/2005 | Vimercati et al. | |
| 2005/0063236 A1 | 3/2005 | Pagliato et al. | |
| 2005/0201169 A1 | 9/2005 | Demange et al. | |
| 2005/0270833 A1 * | 12/2005 | Seevinck et al. | 365/177 |

FOREIGN PATENT DOCUMENTS

| | | |
|---|---|---|
| WO | 2004015713 A1 | 2/2004 |

OTHER PUBLICATIONS

Conte, A. et al.; "A High-Performance Very Low-Voltage Current Sense Amplifier for Nonvolatile Memories"; IEEE Journal of Solid State Circuits; Feb. 2005; pp. 507-514; vol. 40, No. 2; IEEE.

* cited by examiner

NONVOLATILE MEMORY HAVING LATCHING SENSE AMPLIFIER AND METHOD OF OPERATION

FIELD OF THE INVENTION

The present invention relates generally to memories, and more particularly to a memory having a latching sense amplifier.

RELATED ART

It is desirable to design memories capable of facilitating high speed operation while utilizing low voltages. However, as voltages continue to scale down, less flexibility is tolerated in the sense amplifier. For example, there are different requirements for optimizing the memory sensing circuit for precharging than for sensing, and, as the voltage continues to scale, it becomes increasingly difficult to optimize for both precharging and sensing.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The terms "assert" or "set" and "deassert" (or "negate" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Therefore, each signal described herein may be designed as positive or negative logic, where negative logic can be indicated by "bar" or "b" following the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, those signals described as positive logic signals may be implemented as negative logic signals, and those signals described as negative logic signals may be implemented as positive logic signals.

Figure 1:
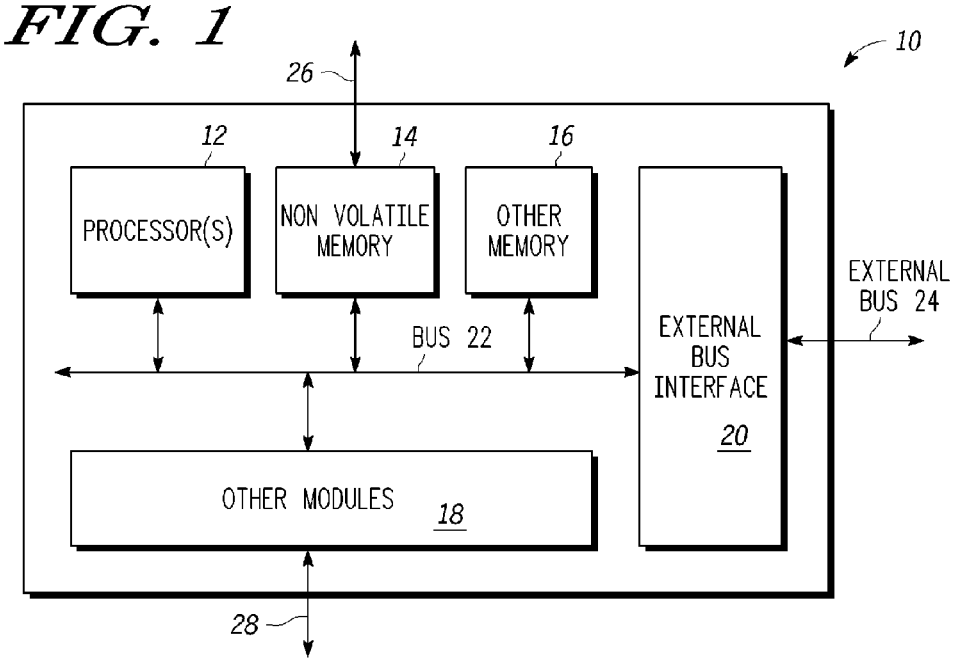
FIG. 1 illustrates, in block diagram form, an integrated circuit in accordance with one embodiment of the present invention.

FIG. 1 illustrates, in block diagram form, an integrated circuit 10 in accordance with one embodiment of the present invention. In the illustrated embodiment, integrated circuit (IC) 10 comprises one or more processors 12, one or more nonvolatile memories 14, one or more other memories 16, one or more other modules 18, and an external bus interface 20 which may be bi-directionally coupled by way of bus 22. Alternate embodiments may not have a processor 12, may not have other memory 16, may not have other modules 18, and/or may not have external bus interface 20. In the illustrated embodiment, external bus interface 20 is coupled to an external bus 24 which may be used to communicate information to and from IC 10. Nonvolatile memory 14 is coupled to one or more integrated circuit terminals 26 which may be used to communicate information between memory 16 and circuitry (not shown) that is external to IC 10. In one embodiment, one or more of modules 12, 16, and 18 may have one or more integrated circuit terminals (not shown) which may be used to communicate information to and/or from circuitry (not shown) that is external to IC 10. Note that in other embodiments IC 10 may have one or more nonvolatile memories 14. Also, note that nonvolatile memory 14 may be any type of nonvolatile memory, such as, for example, a FLASH memory, a magneto-resistive random access memory (MRAM), etc.

Figure 2:
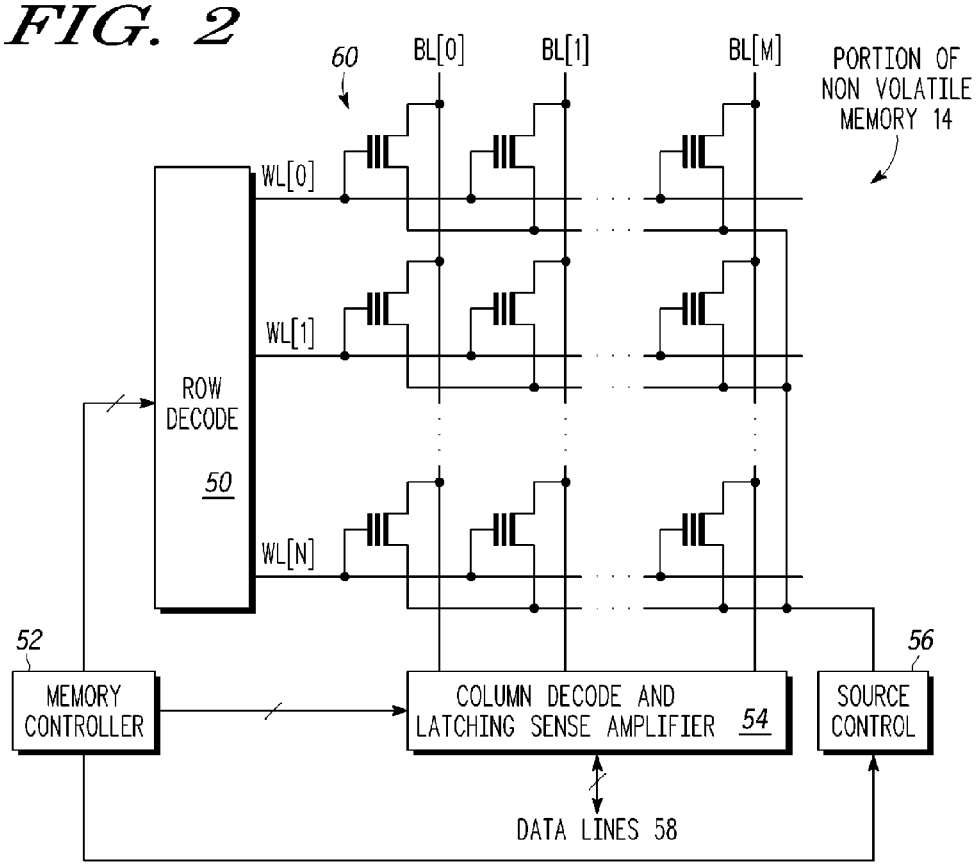
FIG. 2 illustrates, in block diagram form, a portion of nonvolatile memory 14 of FIG. 1 in accordance with one embodiment of the present invention.

FIG. 2 illustrates, in block diagram form, a portion of nonvolatile memory 14 of FIG. 1 in accordance with one embodiment of the present invention. In the illustrated embodiment, nonvolatile memory 14 includes a plurality of bitcells, such as bitcell 60, at the intersection of each bitline (BL[0], BL[1] . . . BL[M]) and wordline (WL[0], WL[1] . . . WL[N]). Therefore, in the illustrated embodiment, nonvolatile memory 14 is an M by N memory having N×M bitcells. However, note that the bitcells illustrated FIG. 2 may represent a memory array or memory block of nonvolatile memory 14 or may only be a portion of a memory array or memory block of nonvolatile memory 14. In the illustrated embodiment, memory controller 52 provides signals to row decoder 50 to select one row or wordline. Once a wordline is selected in this manner, memory controller 52 provides a plurality of column select signals to column decode and latching sense amplifier circuit 54 in order select the desired column(s). Once the desired row and column is selected, current from the desired bitcells ($I_{bitcell}$) is available at the inputs to the latching sense amplifiers in circuit 54. These sense amplifiers in circuit 54 convert the received current to data values (data lines 58) that can be read as the values stored in the selected bitcells. Source control circuit 56 receives and uses a plurality of control signals from the memory controller 52 to determine whether to float or ground the common source for the bitcells.

Figure 3:
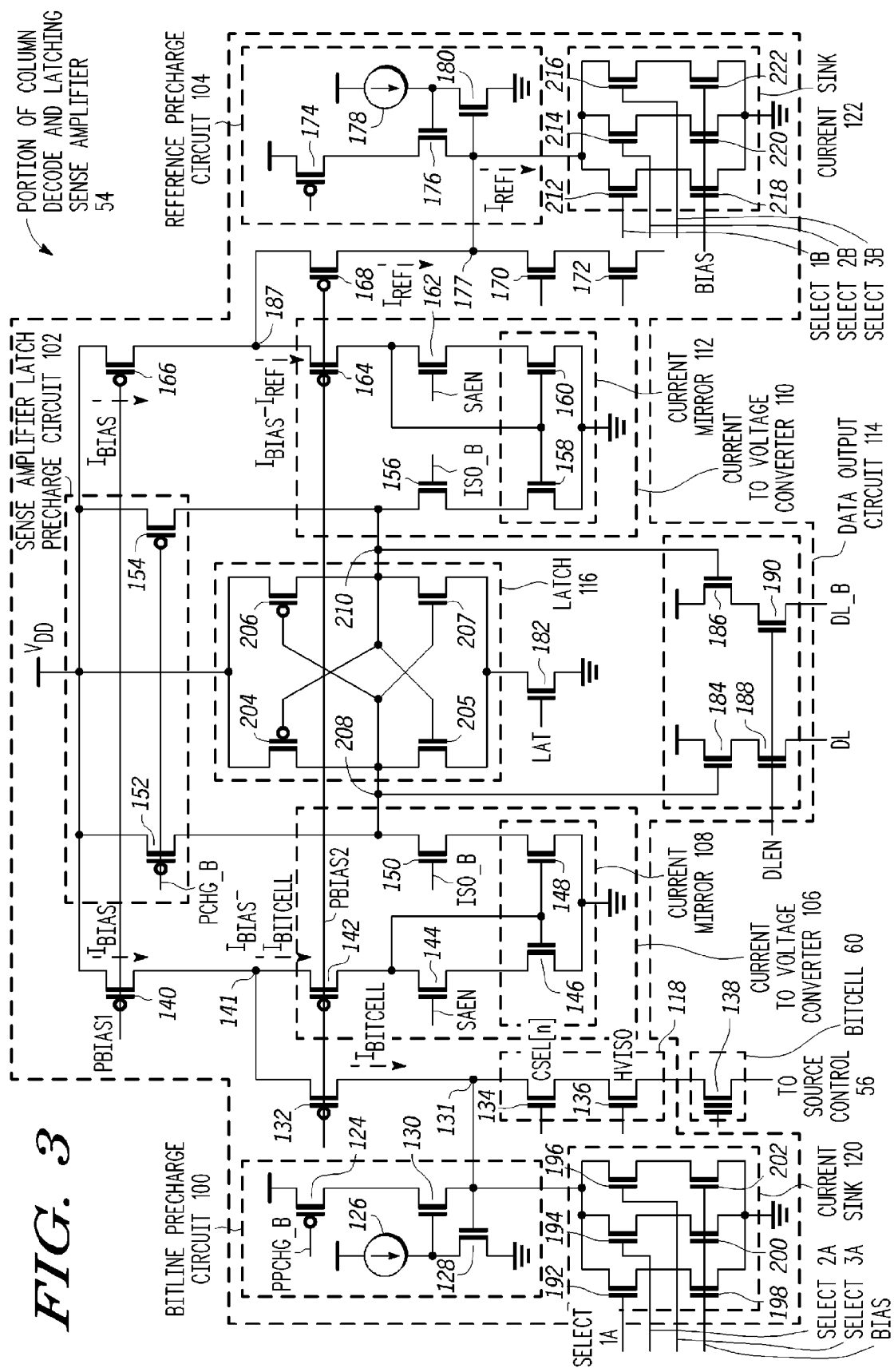
FIG. 3 illustrates, in block diagram form, a portion of column decode and latching sense amplifier 54 of FIG. 2 in accordance with one embodiment of the present invention.

FIG. 3 illustrates a portion of column decode and latching sense amplifier circuit 54 coupled to bitcell 60. Note that bitcell 60 is only provided as an example, where any bitcell of FIG. 2 could be used to describe operation of FIG. 3. Circuit 54 includes a latch 116, a sense amplifier latch precharge circuitry 102, bitline precharge circuits 100 and 104, current-to-voltage converters 106 and 110, and current sinks 120 and 122.

Bitline precharge circuit 100 includes a p-channel transistor 124 having a control electrode coupled to receive a signal ppchg_b and a first current electrode coupled to VDD. Bitline precharge circuit 100 also includes an n-channel transistors 130 and 128 and a current source 126. A first terminal of current source 126 is coupled to VDD, a second terminal of current source 126 is coupled to a control electrode of transistor 130 and a first current electrode of transistor 128 (i.e. coupled to node 131). A second current electrode of transistor 128 is coupled to ground. A first current electrode of transistor 130 is coupled to a second current electrode of transistor 124, and the second current electrode of transistor 130 is coupled to a control electrode of transistor 128 (i.e. coupled to node 131). The second current electrode of transistor 130 and the control electrode of transistor 128 are coupled to current sink 120.

Current sink 120 includes n-channel transistor 192, 194, 196, 198, 200, and 202. A first current electrode of each of transistors 192, 194, and 196 is coupled to the second current electrode of transistor 130 (i.e. coupled to node 131), and a second current electrode of each of transistors 192, 194, and 196 is coupled to a first current electrode of each of transistors 198, 200, and 202, respectively. A second current electrode of each of transistors 198, 200, and 202 is coupled to ground. Each of the control electrodes of transistors 192, 194, and 196 is coupled to receive control signals select 1*a*, select 2*a*, and select 3*a*, respectively. Each of the control electrodes of transistors 198, 200, and 202 is coupled to receive bias.

Circuit portion 118 includes an n-channel transistor 134 having a first electrode coupled to the second electrode of transistor 130, and an n-channel transistor 136 having a first current electrode coupled to the second current electrode of transistor 134. Bitcell 60 includes a floating gate transistor 138 having a first current electrode coupled to the second current electrode of transistor 136 and a second current electrode coupled to source control 56.

Circuit 54 also includes a p-channel transistor 140 having a first current electrode coupled to VDD, a control electrode coupled to receive pbias1, and a second current electrode coupled to a node 141. Circuit 54 also includes a p-channel transistor 132 having a first current electrode coupled to node 141 (the second current electrode of transistor 140), a control electrode coupled to receive pbias2, and a second current electrode coupled to the second current electrode of transistor 130 and the first current electrode of transistor 134.

Current-to-voltage converter 106 includes a p-channel transistor 142, and n-channel transistors 144, 146, 148, and 150. A first current electrode of transistor 142 is coupled to the second current electrode of transistor 140 (i.e. coupled to node 141) and a control electrode coupled to receive pbias2. Transistor 144 has a first current electrode coupled to a second current electrode of transistor 142 and a control electrode coupled to receive a control signal sense amplifier enable (saen). A first current electrode 146 is coupled to the second electrode of transistor 144, a control electrode coupled to the first current electrode of transistor 144, and a second current electrode coupled to ground. A first current electrode of transistor 150 is coupled to node 208, which is a first storage node latch 116 and a control electrode is coupled to receive a control signal isolation_bar (iso_b). A first current electrode of transistor 148 is coupled to a second current electrode of transistor 150, a control electrode coupled to the control electrode of transistor 146, and a second current electrode of transistor 148 coupled to ground. Note that transistors 148 and 146 are configured as a current mirror and therefore may be referred to as current mirror 108.

Latch 116 includes p-channel transistors 204 and 206 and n-channel transistors 205 and 207. Transistors 204 and 205 form a first inverter and transistors 206 and 207 form a second inverter where the two inverters are cross coupled to form latch 116. The input of the second inverter formed by transistors 206 and 207 is labeled as node 208 (the first storage node of latch 116), and the input of the first inverter formed by transistors 204 and 205 is labeled as node 210 (a second storage node of latch 116).

Circuit 54 also includes an n-channel transistor 182 having a first current electrode coupled to latch 116, a control electrode coupled to receive a control signal lat, and a second control electrode coupled to ground.

Sense amplifier latch precharge circuit 102 includes p-channel transistors 152 and 154. Transistor 152 has a first current electrode coupled to VDD, a control electrode coupled to receive pchg_b, and a second current electrode coupled to node 208. Transistor 154 has a first current electrode coupled to VDD, a control electrode coupled to receive pchg_b, and a second current electrode coupled to node 210.

Reference precharge circuit 104 includes p-channel transistor 174, n-channel transistors 176 and 180, and current source 178. The connectivity of circuit 104 is analogous to the connectivity of transistors 124, 130, 128, and 126, respectively, of circuit 100. Current sink 122 includes n-channel transistors 212, 214, 216, 218, 220, and 222. The connectivity of current sink 122 is analogous to the connectivity of transistors 192, 194, 196, 198, 200, and 202, respectively, of current sink 120, except that the control electrodes of each of transistors 212, 214, and 216, receive control signals select 1*b*, select 2*b*, and select 3*b*, respectively. Current-to-voltage converter 110 is coupled to node 210 and includes p-channel transistor 164 and n-channel transistors 162, 160, 158, and 156. The connectivity of converter 110 is analogous to the connectivity of transistors 142, 144, 146, 148, and 150, respectively.

Circuit 54 also includes p-channel transistor 166 and 168. A first current electrode of transistor 166 is coupled to VDD, a second current electrode is coupled to transistor 164 of current-to-voltage converter 110 (i.e. coupled to a node 187), and a control electrode is coupled to receive pbias1. A first current electrode of transistor 168 is coupled to the second current electrode of transistor 166 (i.e. coupled to node 187), a control electrode is coupled to receive pbias2, and a second current electrode is coupled to reference precharge circuit 104. Circuit 54 also includes n-channel transistors 170 and 172, where a first current electrode of transistor 170 is coupled to the second current electrode of transistor 168 (where the second current electrode of transistor 168 and the first current electrode of transistor 170 are coupled to a node 177), and a first current electrode of transistor 172 is coupled to a second current electrode of transistor 170.

Data output circuit 114 includes n-channel transistors 184, 186, 188, and 190. A first current electrode of transistor 184 is coupled to VDD and a control electrode of transistor 184 is coupled to node 208. A first current electrode of transistor 186 is coupled to VDD and a control electrode of transistor 186 is coupled to node 210. A first current electrode of transistor 188 is coupled to a second current electrode of transistor 184, a current electrode is coupled to receive a data line enable (dlen), and a second current electrode of transistor 188 provides a data output d1. A first current electrode of transistor 190 is coupled to a second current electrode of transistor 186, a current electrode is coupled to receive dlen, and a second current electrode of transistor 190 provides a data output d1_b.

Figure 4:
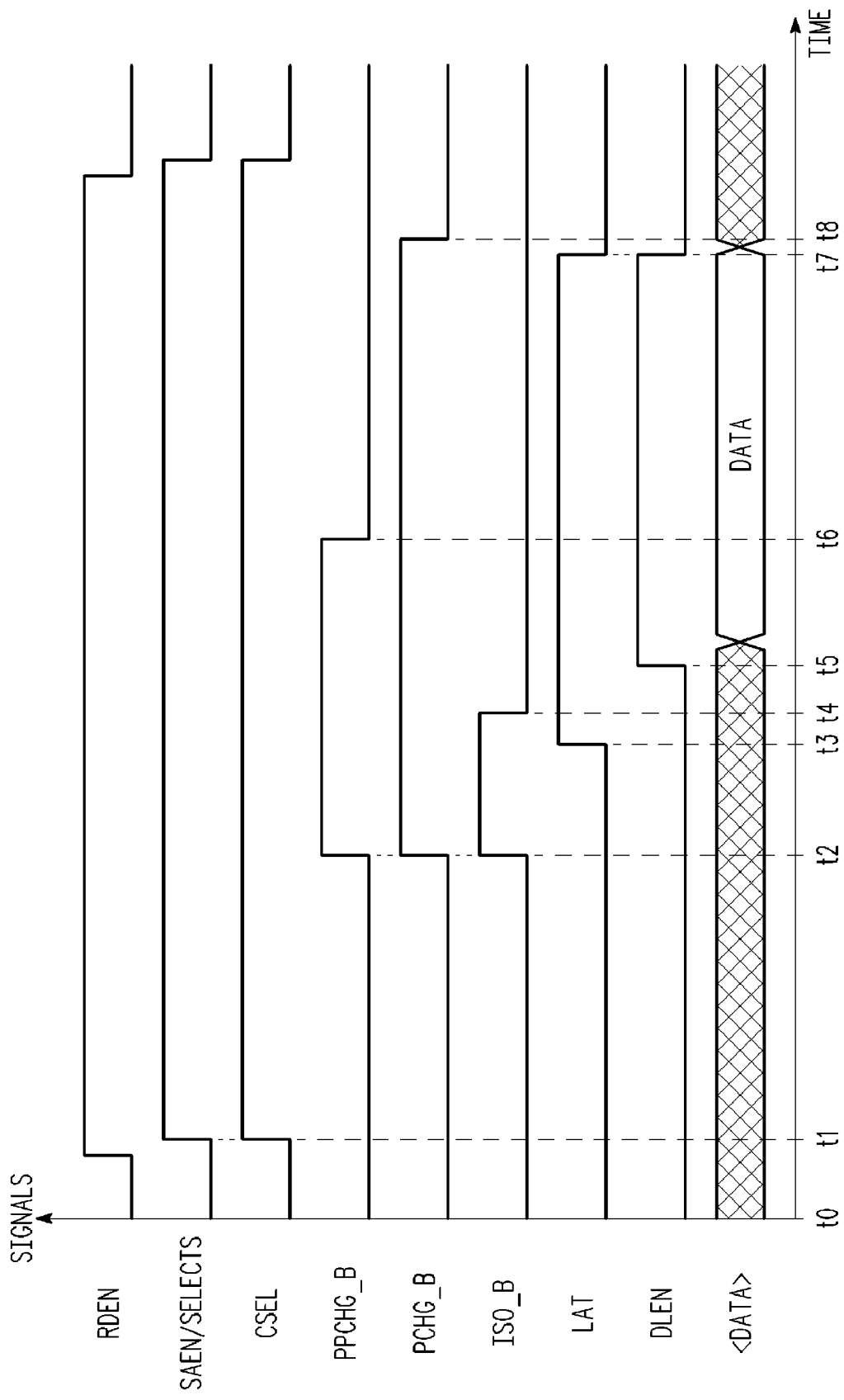
FIG. 4 illustrates a timing diagram for various signals present in FIG. 3 in accordance with one embodiment of the present invention.

In operation, latch 116 senses voltages at nodes 208 and 210, and latches a resulting value, where the voltage at node 208 results from the bitcell current $I_{bitcell}$ through bitcell 60 and the voltage at node 210 results from the reference current $I_{ref}$. This resulting value is then provided, via data output circuit 114, as the data output, representative of the value stored in bitcell 60. In one embodiment, $I_{ref}$ has a value of approximately 10 microamps. In one embodiment, $I_{ref}$ is designed to have a value between the maximum and minimum values of $I_{bitcell}$ (i.e. between the value of $I_{bitcell}$ when the bitcell stores a logic level one and the value of $I_{bitcell}$ when the bitcell stores a logic level zero.) More detailed operation of FIG. 3 will be discussed in reference to the timing diagram of FIG. 4.

From at least time t0, ppchg_b, pchg_b, and iso_b are asserted, which turn on transistors 124, 174, 152, 154, and turn off transistors 150 and 156. With transistors 150 and 156 being off, latch 116 is isolated from current-to-voltage converters 106 and 110.

At time t1, a read enable signal (rden) is asserted, such as, for example, by memory controller 52 in response to an access request by, for example, processor 12. Assertion of read enable results in the assertion of saen and assertion of the current sink select signals which includes select 1a, select 2a, select 3a, select 1b, select 2b, and select 3b. The values of these selects determine a value of the respective current sink 120 or 122, and may be provided, for example, by memory controller 52. In one embodiment, select 1b, select 2b, and select 3b are all asserted such that current sink 122 represents the full value of all three current sinks, thus producing the current $I_{ref}$. Since transistors 170 and 172 are off at this point, this current $I_{ref}$ appears through transistor 164 (between nodes 187 and 177). In this embodiment, select 1a, select 1b, and select 1c are negated such that current sink 120 produces zero current. Note that by asserting none, one, two, or three of the select signals in each of the current sinks, the value of the resulting current can be 0, full ($I_{ref}$), or a fractional value of $I_{ref}$ (e.g. ⅓ $I_{ref}$, ⅔ $I_{ref}$). Also, assertion of the read enable results in assertion of the appropriate column select line (csel), which turns on transistor 134. (At this point, note that high voltage isolation transistor 136 is also on.)

With transistor 124 turned on by ppchg_b, node 131 gets precharged to a precharge voltage by the regulated cascode circuit formed by transistors 128 and 130 and current source 126. That is, the selected bitline (selected by the column select signal csel) gets precharged to the precharge voltage in response to the precharge signal ppchg_b. Similarly, with transistor 174 turned on by ppchg_b, node 177 gets precharged to a precharge voltage by the regulated cascode circuit formed by transistors 176 and 180 and current source 178. In one embodiment, the regulated cascodes of bitline precharge circuit 100 and reference precharge circuit 104 precharge nodes 131 and 177, respectively, to a same precharge voltage. However, due to the increased capacitance at node 131 as compared to node 177, node 177 precharges more quickly than node 131.

Also, with transistors 152 and 154 turned on, nodes 208 and 210 get precharged to VDD. That is, nodes 208 and 210 get precharged in response to the precharge signal pchg_b. Note that in alternate embodiments, nodes 208 and 210 can get precharged to another level other than VDD; however, in many cases, nodes 208 and 210 are at least precharged to a same level. Note that since iso_b is also asserted when ppchg_b and pchg_b are asserted, storage nodes 208 and 210 of latch 116 are electrically isolated from a power supply voltage terminal (e.g. VSS or ground) concurrently with precharging of nodes 208 and 210.

At a time t2, ppchg_b, pchg_b, and iso_b all get deasserted, thus turning off transistors 124, 174, 152, and 156, and turning on transistors 150 and 156. This point may be referred to as the start of a settle period which allows the currents and voltages of the circuit to settle prior to sensing the bitcell value through the assertion of the lat signal at time t3. Also, since transistors 150 and 156 are turned on due to the deassertion of iso_b, latch 116 is enabled. Starting at time t2, the current through bitcell 60 flows as labeled in FIG. 3 (down from node 141, through node 131, to bitcell 60), where the value of $I_{bitcell}$ depends on whether transistor 138 is storing a logic level zero or one. Due to the current, $I_{bias}$, generated by transistors 140 (operating as a current source controlled by pbias1), the current from node 141 into current-to-voltage converter 106 is $I_{bias}-I_{bitcell}$. This current gets converted to a voltage which appears at node 208. That is, since saen is asserted and iso_b is negated, transistors 144 and 150 are turned on, and current mirror 108 operates to mirror the current $I_{bias}-I_{bitcell}$. Transistor 168 operates as a current source controlled by pbias2 which produces current $I_{ref}$. Therefore, since current $I_{bias}$ is also generated by transistor 166 and pbias1, the current flowing from node 187 to current-to-voltage converter 110 is $I_{bias}-I_{ref}$. This current gets converted to a voltage which appears at node 210. In one embodiment, $I_{ref}$ is set to a value that falls between the value of $I_{bitcell}$ if bitcell 60 stored a logic level zero and the value of $I_{bitcell}$ if bitcell 60 stored a logic level one.

Therefore, depending on which voltage (the voltage at node 208 resulting from $I_{bias} I_{bitcell}$ or the voltage at node 210 resulting from $I_{bias}-I_{ref}$) reaches a level of approximately VDD-VTP (with VTP being the threshold voltage of transistor 204 and 205) first, the opposite node gets pulled up to VDD, eventually causing the "winning" storage node (i.e. the storage node which first reached approximately VDD-VTP) to start approaching zero. For example, assuming node 208 "wins" by reaching VDD-VTP first, node 210 gets pulled up to VDD, and node 208 starts approaching zero. At time t3, after the settle period, the signal lat is asserted, thus turning on transistor 182 which allows node 208 to more fully reach zero. Therefore, in this case, a logic level zero is provided at output d1 and a logic level one is provided at output d1_b when, at time t5, dlen is asserted. Similarly, assuming node 210 "wins" by reaching VDD-VTP first, node 208 gets pulled up to VDD, and node 210 starts approaching zero. At time t3, after the settle period, the signal lat is asserted, thus turning on transistor 182 which allows node 210 to more fully reach zero. In this case, a logic level one is sensed and provided at output d1 and a logic level zero is provided at output d1_b when, at time t5, dlen is asserted. Therefore, latch 116 is used to determine the logic state of bitcell 60.

Also, note that after lat is asserted, iso_b is deasserted at time t4 (prior to time t5 at which dlen is asserted) which results in transistors 150 and 156 turning off, thus allowing for latch 116 to reach the rails faster.

Therefore, after time t5, with transistors 188 and 190 turned on by dlen, the data stored in bitcell 60 (or in any of the selected bitcell(s)) can be read at d1 and d1_b, which may correspond to at least a portion of data lines 58 of FIG. 2.

In the illustrated timing diagram, note that at time t6, during which the data read out of bitcell 60 is still valid and available, ppchg_b is asserted such that bitline precharge circuits 110 and 104 can begin precharging for the next cycle. In this manner, a next read operation can be started prior to the full completion of a current read, thus allowing for faster consecutive accesses. Therefore, nonvolatile memory 14 may also be referred to as a pipelined nonvolatile memory.

At time t7, lat and dlen are deasserted, at which point the data on data lines 58 is no longer valid. At time t8, pchg_b is asserted which begins precharging of nodes 208 and 210. Read enable, saen, csel, and the select lines are all deasserted after time t8, in preparation for a subsequent access.

Note that bitline precharge circuit 100 operates in parallel with the sensed bitcell current path. That is, when sensing the bitcell current, $I_{bitcell}$, such as during time t2 to t4, note that transistor 130 is not within the sensed current path. In this manner, transistor 130 can be optimized for improved precharge, without affecting the path which produces the bitcell current to be sensed at node 208. Also, because the sensed bitcell current path does not include bitline precharge circuit 100, the required voltage headroom has been lowered for sensing, allowing for improved flexibility and improved sensing. Also, note that two separate precharge circuits and precharge signals (ppchg_b and pchg_b) are used for precharging the bitline and for precharging storage nodes 208 and 210, where, in one embodiment, the bitline and the storage nodes can be precharged to different precharge voltages.

Also, note that current sinks 120 and 122 allow for the application of fractional amounts of currents depending on the values of select 1a, 2a, 3a, 1b, 2b, and 2c. For example, in one embodiment, during a program-read or a write-read cycle, in which a pulsing signal may be applied to program a memory, a subsequent verify cycle, which is similar to a read cycle used to determine whether the pulsing was successful in programming the memory, the current sinks could by set to a fractional amount. For example, in reference to bitcell 60, select 1a could be asserted, resulting in a current of ⅓ $I_{ref}$ flowing down from node 131, which would subtract from the current through bitcell 60.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Note that the term "couple" has been used to denote that one or more addition conductive elements may be interposed between two elements that are coupled.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A memory comprising:
    a plurality of memory cells, each of the plurality of memory cells coupled to a bitline of a plurality of bitlines and to a wordline of a plurality of word lines; and
    a sense amplifier for being selectively coupled to one of the plurality of bitlines, the sense amplifier comprising:
        a first precharge circuit for precharging a selected bitline to a first predetermined voltage in response to a first precharge signal;
        a current-to-voltage converter having a current input coupled to the selected bitline, and a voltage output, wherein the current input node is coupled to a sensed bitcell current path included within the current-to-voltage converter, wherein the sensed bitcell current path operates in parallel with the first precharge circuit, and wherein the first precharge circuit is not within the sensed bitcell current path;
        a latch circuit having a storage node coupled to the voltage output of the current-to-voltage converter; and
        a second precharge circuit for precharging the storage node of the latch circuit to a second predetermined voltage in response to a second precharge signal.

2. The memory of claim 1, wherein the plurality of memory cells is characterized as being a plurality of nonvolatile memory cells.

3. The memory of claim 1, wherein the current-to-voltage converter comprises:
    a first transistor having a first current electrode for providing the current input for the current-to-voltage converter, a control electrode coupled to receive a bias voltage, and a second current electrode;
    a second transistor having a first current electrode coupled to the second current electrode of the first transistor, a control electrode for receiving a sense enable signal, and a second current electrode;
    a current mirror having an input coupled to the second current electrode of the second transistor, and an output; and
    a third transistor having a first current electrode coupled to the output of the current mirror, a control electrode coupled to receive an isolation control signal, and a second current electrode coupled to the storage node of the latch circuit.

4. The memory of claim 1, wherein the memory is implemented with a data processor on an integrated circuit.

5. The memory of claim 1, wherein the first precharge circuit comprises:
    a first transistor having a first current electrode coupled to a first power supply voltage terminal, a control electrode for receiving the first precharge signal, and a second current electrode;
    a current source having a first terminal coupled to the first power supply voltage, and a second terminal;
    a second transistor having a first current electrode coupled to the second current electrode of the first transistor, a control electrode coupled to the second terminal of the current source, and a second current electrode coupled to the selected bitline,
    a third transistor having a first current electrode coupled to the second terminal of the current source, a control electrode coupled to the second terminal of the second transistor, and a second current electrode coupled to a second power supply voltage terminal; and a current sink having a first terminal coupled to the coupled to second current electrode of the second transistor, and a second terminal coupled to the second power supply voltage terminal.

6. The memory of claim 5, wherein a current provided by the current sink is selectable in response to a select signal.

7. The memory of claim 1, wherein the latch circuit comprises
a first inverter having an input terminal coupled to the storage node, and an output terminal; and
a second inverter having an input terminal coupled to the output terminal of the first inverter at a second storage node, and an output terminal coupled to the input terminal of the first inverter.

8. The memory of claim 7, further comprising a second current-to-voltage converter having a current input coupled to receive a bias current, and a voltage output coupled to the second storage node.

9. The memory of claim 8, wherein the second precharge circuit is for precharging the second storage node to the second precharge voltage.

10. The memory of claim 9, wherein the second precharge circuit comprises:
a first transistor having a first current electrode coupled to a first power supply voltage terminal, a control electrode for receiving the second precharge signal, and a second current electrode coupled to the storage node; and
a second transistor having a first current electrode coupled to the first power supply voltage terminal, a control electrode for receiving the second precharge signal, and a second current electrode coupled to the second storage node.

11. The memory of claim 1, wherein during a data read out cycle of a selected memory cell, the first precharge signal is asserted such that the first precharge circuit begins precharging for a next cycle prior to full completion of the current read cycle.

12. A sense amplifier comprising:
a first precharge circuit for precharging a selected bitline to a first predetermined voltage in response to a first precharge signal;
a first current-to-voltage converter having a first current input node coupled to the selected bitline, and a voltage output for providing a first voltage corresponding to a sensed current on the selected bitline, wherein the first current input node is coupled to a sensed bitcell current path included within the first current-to-voltage converter, wherein the sensed bitcell current path operates in parallel with the first precharge circuit, and wherein the first precharge circuit is not within the sensed bitcell current path;
a latch circuit having a first storage node coupled to the voltage output of the first current-to-voltage converter, and a second storage node;
a second current-to-voltage converter having a second current input coupled to receive a reference current, and a voltage output for providing a second voltage corresponding to the reference current to the second storage node; and
a second precharge circuit for precharging the first and second storage nodes of the latch circuit to a second predetermined voltage in response to a second precharge signal.

13. The sense amplifier of claim 12, wherein the sense amplifier is for sensing a logic state of a non-volatile memory cell coupled to the selected bitline.

14. The sense amplifier of claim 12, wherein the first current-to-voltage converter comprises:
a first transistor having a first current electrode for providing the first current input for the current-to-voltage converter, a control electrode coupled to receive a bias voltage, and a second current electrode;
a second transistor having a first current electrode coupled to the second current electrode of the first transistor, a control electrode for receiving a sense enable signal, and a second current electrode;
a current mirror having an input coupled to the second current electrode of the second transistor, and an output; and
a third transistor having a first current electrode coupled to the output of the current mirror, a control electrode coupled to receive an isolation control signal, and a second current electrode coupled to the storage node of the latch circuit.

15. The sense amplifier of claim 12, wherein the first precharge circuit comprises:
a first transistor having a first current electrode coupled to a first power supply voltage terminal, a control electrode for receiving the first precharge signal, and a second current electrode;
a current source having a first terminal coupled to the first power supply voltage, and a second terminal;
a second transistor having a first current electrode coupled to the second current electrode of the first transistor, a control electrode coupled to the second terminal of the current source, and a second current electrode coupled to the selected bitline; and
a third transistor having a first current electrode coupled to the second terminal of the current source, a control electrode coupled to the second terminal of the second transistor, and a second current electrode coupled to a second power supply voltage terminal.

16. The sense amplifier of claim 15, further comprising a current sink having a first terminal coupled to second current electrode of the second transistor, and a second terminal coupled to the second power supply voltage terminal, wherein a current provided by the current sink is selectable in response to a select signal.

17. The sense amplifier of claim 16, wherein the current sink comprises:
a select transistor coupled in series with a second current sink, wherein the first select transistor couples to the second current sink to the second current electrode of the second transistor in response to the select signal.

18. The memory of claim 12, wherein the latch circuit comprises
a first inverter having an input terminal coupled to the first storage node, and an output terminal;
a second inverter having an input terminal coupled to the output terminal of the first inverter at the second storage node, and an output terminal coupled to the input terminal of the first inverter; and
a transistor having a first current electrode coupled to both the first and second inverters, a control electrode for receiving a latch signal, and a second current electrode coupled to a power supply voltage terminal.

19. The sense amplifier of claim 12, wherein the sense amplifier is a portion of a pipelined non-volatile memory.

20. The sense amplifier of claim 12, wherein during a data read out cycle of a selected memory cell, the first precharge signal is asserted such that the first precharge circuit begins precharging for a next cycle prior to full completion of the current read cycle.

21. A method for reading a non-volatile memory having a plurality of memory cells coupled to wordlines and bitlines, the method comprising:

precharging a selected bitline, via a first precharge circuit, to a first predetermined voltage in response to receiving a first precharge signal, wherein during the current data read out cycle of a memory cell, the first precharge signal is asserted such that the first precharge circuit begins precharging for a next cycle prior to a full completion of the current read cycle;

precharging a storage node of a latch circuit to a second predetermined voltage in response to receiving a second precharge signal;

coupling a current-to-voltage converter to the latch circuit, wherein the current-to-voltage converter includes a current input node coupled to a sensed bitcell current path included within the current-to-voltage converter, and wherein the sensed bitcell current path operates in parallel with the first precharge circuit and the first precharge circuit is not within the sensed bitcell current path;

enabling the latch circuit;

converting a current representing a logic state of a memory cell coupled to the selected bitline to a voltage via the current-to-voltage converter, and providing the voltage to the storage node;

isolating the current-to-voltage converter from the latch circuit;

determining the logic state of the memory cell using the latch circuit; and providing a data bit corresponding to the logic state of the memory cell.

22. The method of claim 21, further comprising electrically isolating the storage node from a power supply voltage terminal concurrently with precharging the storage node.

* * * * *